United States Patent [19]
Price

[11] Patent Number: 4,678,937
[45] Date of Patent: Jul. 7, 1987

[54] ELECTRICAL ISOLATION CIRCUIT

[75] Inventor: Timothy D. Price, Barnham, England

[73] Assignee: Rosemount Engineering Company Limited, England

[21] Appl. No.: 576,909

[22] Filed: Feb. 3, 1984

[51] Int. Cl.[4] .................... H03K 3/42; G02B 27/00; G02F 1/00
[52] U.S. Cl. .................... 307/311; 307/514; 250/551; 455/602
[58] Field of Search ............ 307/311, 514, 268, 601; 328/55, 164; 250/551; 455/601, 602

[56] References Cited

U.S. PATENT DOCUMENTS

| | | | |
|---|---|---|---|
| 2,794,123 | 5/1957 | Younker | 328/55 |
| 2,931,981 | 4/1960 | Schabauer | 328/55 |
| 4,075,474 | 2/1978 | Staus et al. | 250/199 |
| 4,140,914 | 2/1979 | Jones | 250/551 |
| 4,262,220 | 4/1981 | Delacruz | 307/311 |
| 4,292,551 | 9/1981 | Kolmann | 307/311 |
| 4,504,974 | 3/1985 | Rademaker | 307/311 |

OTHER PUBLICATIONS

Hodapp, Mark, "Optical Isolators Yield Benefits in Many Linear Circuits", *Electronics*, vol. 49, No. 5, Mar. 4, 1976, pp. 105-110.

Voynovich, B., "Optical Isolator", *New Electronics*, vol. 10, No. 15, Jul. 26, 1977, p. 15.

*Primary Examiner*—Stanley D. Miller
*Assistant Examiner*—B. P. Davis
*Attorney, Agent, or Firm*—Kinney & Lange

[57] ABSTRACT

A circuit provides electrical isolation from an input signal which has a leading edge and a trailing edge. On the leading edge of the input signal, a first signal is transmitted across an isolation device to provide a first isolated signal representative of the leading edge of the input signal. On the trailing edge of the input signal, a second signal is transmitted across the isolation device to provide a second isolated signal representative of the trailing edge of the input signal. The first and second isolated signals are electrically isolated from and representative of the input signal.

26 Claims, 6 Drawing Figures

ELECTRICAL ISOLATION CIRCUIT

BACKGROUND OF THE INVENTION

The present invention relates to electrical isolation circuits and in particular an isolation circuit which utilizes at least two signals to represent the signal to be isolated.

Isolation circuits have utilized many different isolation devices, such as electromagnetic coils and optical couplers. Electromagnetic coils have been used mainly to isolate analog signals by coupling the entire analog signal. Optical couplers generally have a light emitting device coupled to a photo sensitive device and have been used to couple digital pulses by techniques including optical coupling of the entire pulse. Optical couplers have also been used to isolate analog signals by measuring received light intensity and by converting analog signals to pulse width modulated, pulse amplitude modulated, and pulse frequency modulated digital signals where the entire signal is coupled through the optical coupler. Coupling an entire pulse through an optical coupler required that the light emitting device and photo sensitive device have substantially equal, time stable and sharply defined turn-on and turn-off time characteristics.

SUMMARY OF THE INVENTION

An isolator circuit provides electrical isolation from an input signal which has a leading edge and a trailing edge. A first means receives the input signal and provides a first signal representative of the leading edge of the input signal. The first means also provides a second signal representative of the trailing edge of the input signal. An isolation means has an input coupled to the first means and has an output. The isolation means provides a first isolated signal responsive to the first signal and a second isolated signal responsive to the second signal at its output which are electrically isolated from and representative of the input signal.

In one preferred embodiment, the isolation means is an optical coupler directly transmitting the first and second signals and receiving the first and second isolated signals. The input signal in this embodiment is a pulse width modulated signal which in turn is representative of an analog input signal. The first and second signals are preferably dc pulses wherein one of the pulses has a duration which is longer than the other, thus distinguishing the leading and trailing edges of the input signal. Thus, the first and second isolated signals are similarly distinctive of the leading and trailing edges of the input signal by having different pulse widths and with suitable logic circuitry are converted to a pulse width modulated signal with a pulse width substantially equal to the pulse width of the input signal.

In a further preferred embodiment, the input signal is a sine wave wherein the leading edge corresponds to the sine wave having a first predetermined level with a positive slope and the trailing edge corresponds to the sine wave having a second predetermined level with a negative slope.

In yet a further preferred embodiment, the isolation means is a single transformer having accurate repeatable turn-on times responsive to the first and second signals. It is desirable that the particular isolation means utilized have fast and repeatable turn-on times and response characteristics suitable for distinguishing between the first and second signals. Use of a single isolation device ensures that the turn-on times in response to the first and second signals are substantially equal, thus increasing the accuracy of the isolator circuit.

One advantage of the present invention is derived from converting the input signal into two signals representative of the leading and trailing edges respectively. This takes advantage of relatively stable turn-on times of isolation devices and places less importance on turn-off times which are usually different than turn-on times causing distortion of the width of the input signal in devices transmitting an entire pulse. While turn-on and turn-off times may vary with time and temperature, the turn-on time of the isolation device will still be substantially equal relative to immediate successive first and second signals, while the turn-off time remains stable enough to distinguish between the first and second signal pulse widths thus maintaining high accuracy over time.

DETAILED DESCRIPTION OF THE PREFERRED EMBODIMENT

Figure 1:
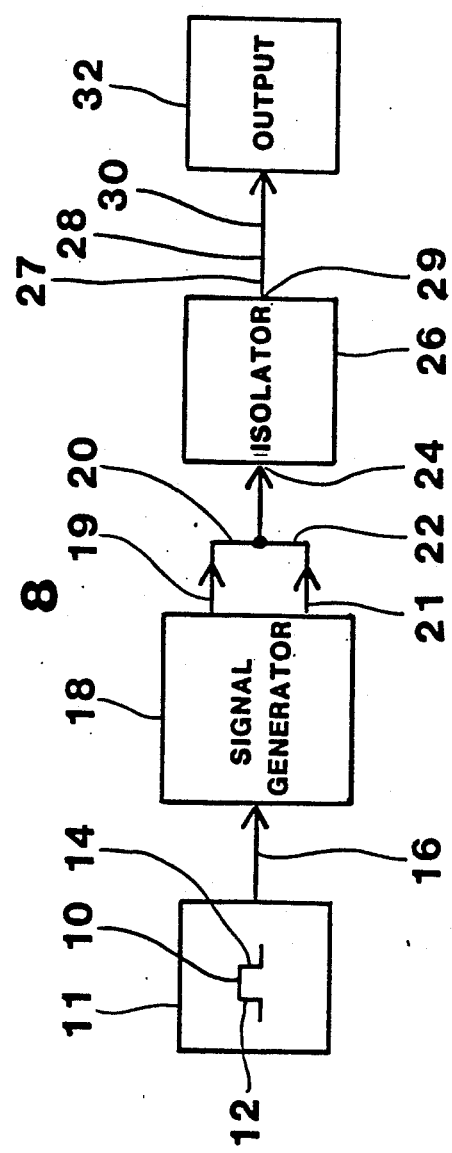
FIG. 1 is a block diagram representation of the present invention having a signal generator coupled to an isolation device.

A preferred embodiment of the present invention is represented in block diagram form of a circuit 8 in FIG. 1. An input signal indicated at 10 is provided by an input circuit 11. Input signal 10 preferably comprises a pulse width modulated square wave signal representative of a signal from a sensor, such as an industrial standard 4 to 20 milliampere signal. Input signal 10 has a leading edge 12 and a trailing edge 14. Input signal 10 is provided along a line 16 to a first means 18, also referred to as signal generator 18. Signal generator 18 receives input signal 10 and provides a first signal 19 on a line 20 and a second signal 21 on a line 22 which are representative of leading edge 12 and trailing edge 14 of input signal 10 respectively. The first signal 19 and second signal 21 are preferably electrical pulses having different pulse widths to distinguish between leading edge 12 and trailing edge 14 of input signal 10. Signal generator 18 preferably provides the first and second signals at substantially equal intervals from receiving the leading edge 12 and the trailing edge 14. Lines 20 and 22 are coupled by a line 23 to an input 24 of an isolation means 26, also referred to as isolator 26. Isolator 26 is preferably a 6N139 opto-coupler, which is photo diode package which provides electrical insulating or dielectric isolation at its output 29 from its input 24. Isolator 26 thus provides distinctive first and second isolated signals 27 and 28 on a line 30 which are electrically isolated from and representative of the first and second signals 19 and 21. First and second isolated signals 27 and 28 are coupled to a suitable output means 32 also referred to as output circuit 32 for processing to provide for example a 1 to 5 volt dc signal representative of the input signal 10.

In further preferred embodiments, output means 32 comprises a visual indication device such as a voltmeter.

In a further preferred embodiment, input signal 10 comprises a sine wave which has a leading edge corresponding to a predetermined level at which the sine wave has a positive slope and a trailing edge corresponding to a predetermined level at which the sine wave has a negative slope. First and second signals 19 and 21 are then representative of the frequency or the amplitude of the sine wave input signal dependent upon the levels chosen, as desired.

Figure 2A:
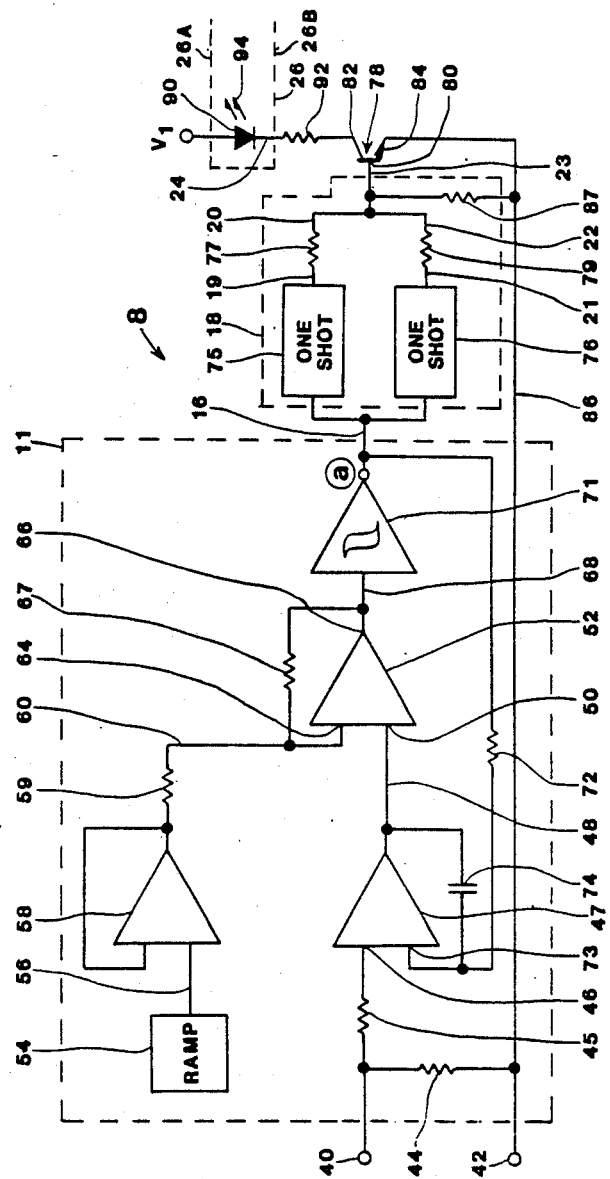
FIGS. 2A and 2B are a schematic diagram of the present invention having a signal generator coupled to an isolation device which in turn is coupled to an output device for providing electrical isolation.
Figure 2B:
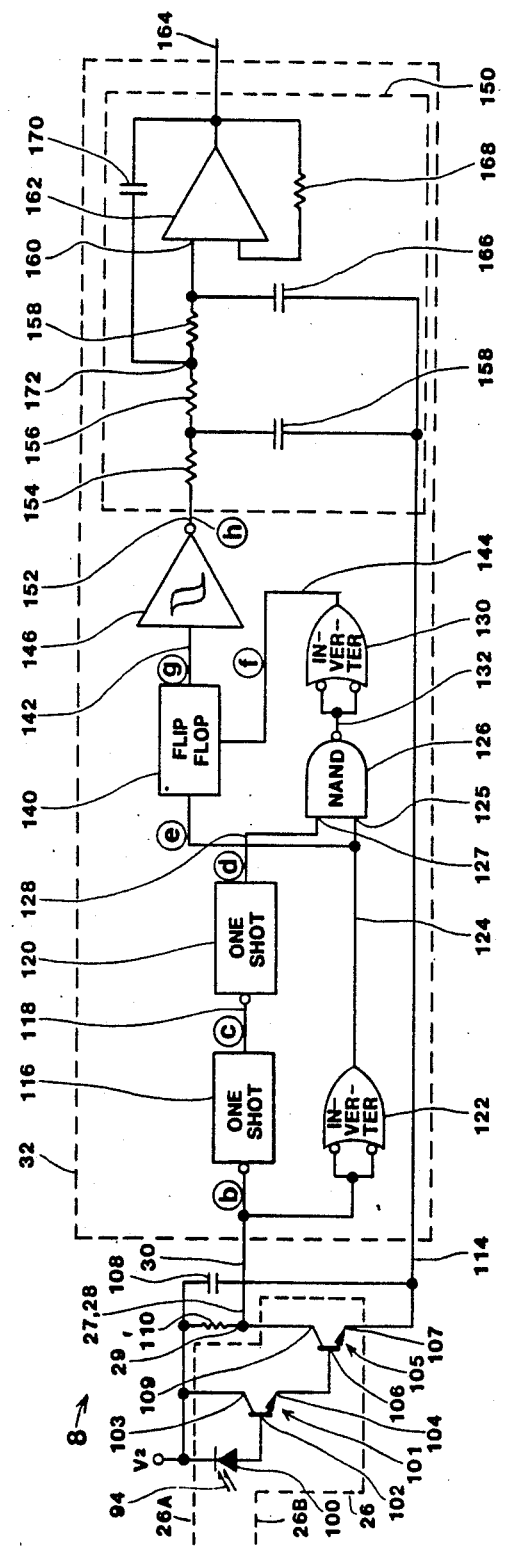

A detailed schematic diagram of circuit 8 indicated in FIGS. 2A and 2B on separate sheets is numbered consistently with FIG. 1. Input circuit 11 in FIG. 2A comprises a pair of input terminals 40, 42. Input terminal 40 receives a field input signal such as a 4 to 20 milliampere signal from a sensor. The field input signal is provided through an input impedance 44 and back through terminal 42. The field input signal is also provided through a resistor 45 which is coupled to terminal 40 to a first input 46 of a buffer amplifier 47. In further preferred embodiments, the field input signal comprises a voltage or frequency signal for which isolation is desired.

Buffer amplifier 47 provides a buffered field signal along a line 48 to a first input 50 of a comparator amplifier 52. A ramp generator 54 provides a ramp signal along a line 56 through a buffer amplifier 58 through a resistor 59 along a line 60 to a second input 64 of comparator amplifier 52. Comparator amplifier 52 provides a square wave alternately having a high level and a low level at its output 66. When the ramp signal at a second input 64 attains an amplitude proximate to the amplitude of the buffered field signal at first input 50, the square wave at output 66 changes level. Output 66 is also coupled through a resistor 63 to second input 64 of comparator amplifier 52. The ramp generator starts a new ramp each time the ramp signal reaches a predetermined maximum level thus again causing a change in level of the square wave.

The square wave has a width representative of the field input signal at terminal 40. Output 66 is coupled by a line 68 to a squaring device 71. Squaring device 71 provides input signal 10 having precisely defined leading and trailing edges 12 and 14. The time between the leading and trailing edges 12 and 14 is representative of the field input signal at terminal 40. Line 16 carries input signal 10 through a resistor 72 to a second input 73 of buffer amplifier 47 for stabilization of the square wave at output 66. Second input 73 of buffer amplifier 47 is also coupled to line 48 through a capacitor 74.

Line 16 is also coupled to signal generator 18 which comprises a first one-shot 75 and a second one-shot 76. First one-shot 75 is configured in a conventional manner to provide first signal 19 on line 20 upon detection of leading edge 12 of input signal 10. Second one-shot 76 is similarly configured to provide second signal 21 on line 22 upon detection of trailing edge 14 of input signal 10. The first signal 19 and second signal 21 preferably are pulses and are distinguishable as by having different durations and respective leading and trailing edges. The first signal 19 preferably has a duration distinguishably longer than the duration of second signal 21.

First one-shot 75 and second one-shot 76 are preferably matched one-shots such that the time between first one-shot 75 receiving the leading edge 12 of input signal 10 and providing first signal 19, and the time between second one-shot 76 receiving the trailing edge 14 of input signal 10 and providing second signal 21 are substantially equal so that the time between the leading edges of first and second signals 19 and 21 accurately represents the input signal 10 pulse width. To preserve this time relationship between the first and second signals 19 and 21, lines 20 and 22 are preferably of equal length and have consistent signal propagation characteristics. Line 20 is coupled to line 23 through a resistor 77, and line 22 is coupled to line 23 through a resistor 79.

A transistor 78 has a base 80 coupled to line 23 and has a collector 82 and an emitter 84. Emitter 84 is coupled to input terminal 42 by a line 86. Base 80 is coupled to line 86 through a resistor 87. A light emitting means 90, also referred to as light emitting diode 90 and a resistor 92 are series coupled between a source V1 and collector 82 of transistor 78. First signal 19 or second signal 21, when received at base 80 of transistor 78, cause a conductive path between source V1 and emitter 84 which forward biases light emitting diode 90 which then emits a light signal represented by arrows 94 having a substantially constant intensity and duration substantially equal to the duration of the first signal 19 or the second signal 21. Light is defined as including electromagnetic radiation in the infrared, visible and ultraviolet portions of the spectrum.

First and second signals 19 and 21 preferably have amplitude and transient characteristics which cause transistor 78 to be conductive from collector 82 to emitter 84 at substantially equal times to preserve the time relationship between the first and second signals 19 and 21. A single light emitting diode 90 is preferably used such that the emitted light preserves the time relationship between first and second signals 19 and 21 as thermal drift effects on the time relationship are substantially eliminated. Use of two light emitting diodes invites different turn-on times due to turn-on time dependence on environmental parameters such as temperature, as well as specification tolerances for a given lot of light emitting diodes which can adversely affect the time relationship between first and second signals 19 and 21.

A light responsive means 100, also referred to as a photo diode 100 in FIG. 2B is optically coupled to light emitting diode 90 to receive the light signals indicated again by arrows 92. Isolator 26 is shown partially in FIG. 2A and partially in FIG. 2B and comprises light emitting diode 90 and photo diode 100. Isolator 26 in FIG. 2A is coupled to the remaining portion of isolator 26 in FIG. 2B by coupling broken lines 26A and 26B in FIG. 2A to corresponding broken lines 26A and 26B in FIG. 2B. Use of a single photo diode as opposed to separate photo diodes further preserves the time relationship between the first and second signals 19 and 21. Photo diode 100 is reverse bias coupled between a source V2 and a first transistor 101 at its base 102. Transistor 101 also has a collector 103 coupled to source V2 and an emitter 104 coupled to a second transistor 105 at its base 106. Transistor 105 has an emitter 107 coupled to source V2 through a capacitor 108 and has a collector 109 coupled to source V2 through a resistor 110. When photo diode 100 receives the light signals, it conducts thus turning on transistors 101 and 105 and provides the first and second isolated signals 27 and 28 at isolator output 29 which is coupled to collector 109 of transistor 105. The first and second isolated signals 27 and 28 are preferably negative going pulses of substantially the same duration and time relationship as first and second signals 19 and 21 respectively with corresponding leading and trailing edges. A line 114 is coupled to emitter 107 of transistor 105 and serves as a ground which is electrically isolated from terminal 42 and field ground. Isolator output 29 is coupled by line 30 to a first one-shot 116 which on receiving the leading edges of the first and second isolated signals 27 and 28 provides a first pulse of a predetermined duration having a leading and trailing edge along a line 118 to a second one-shot 120. Line 30 is also coupled to both inputs of an inverter 122 which has an output coupled by a line 124 to a first input 125 of a nand gate 126. A second input 127 of nand gate 126 is coupled by a line 128 to the output of second one-shot 120. Second one-shot 120 provides a second pulse of predetermined length along line 128 to nand gate 126 and is triggered by the trailing edge of the first pulse from first one-shot 116. Nand gate 126 is coupled to both inputs of an inverter 130 by a line 132. The output of inverter 122 is also coupled by line 124 to a flipflop 140. Thus the first and second isolated signals on line 30 are inverted by inverter 122 and trigger flipflop 140 on their respective leading edges. Flipflop 140 then provides a pulse width modulated output signal on line 142 as a function of the first and second isolated signals 27 and 28. The output of inverter 130 is coupled to flipflop 140 by a line 144 to reset flipflop 140 when flipflop 140 is in an incorrect state with respect to the leading edges of first and second isolated signals on line 124. The durations of the first and second pulses provided by first and second one-shots 116 and 120 are such that if flipflop 140 is being triggered to wrong states by first or second isolated signal 27, 28, such as on startup of circuit 8, nand gate 126 and inverter 130 will cause flipflop 140 to be reset and thenceforth be triggered to correct states.

The pulse width modulated output signal from flipflop 140 on line 142 preferably has the same pulse width as input signal 10 and is electrically isolated therefrom. A squaring device 146 is coupled to line 142 and squares the edges of the pulse width modulated output signal on a line 152. The pulse width modulated output signal on line 152 has an amplitude with respect to isolated ground on line 114 which is consistent with the predetermined maximum amplitude of the ramp generated by ramp generator 54.

A low pass filter 150 is coupled to squaring device 146 by a line 152. Filter 150 comprises a first resistor 154 coupled between line 152 and a second resistor 156. A capacitor 158 is coupled between isolated ground 114 and first and second resistors 154, 156. The end of resistor 156 not directly coupled to resistor 154 is coupled through a resistor 158 to a first input 160 of an amplifier 162. Amplifier 162 provides the dc voltage signal at its output on line 164 representative of input signal 10. First input 160 of amplifier 162 is also coupled to isolated ground 114 through a capacitor 166. The output of amplifier 162 is coupled to a second input of amplifier 162 through a resistor 168. The output of amplifier 162 is also coupled through a capacitor 170 to a junction 172 between resistors 156 and 158.

Filter 150 is preferably a 3 pole low pass filter to smooth the pulse width modulated output signal to provide the voltage signal on a line 164, preferably a 1 to 5 volt dc signal which is representative and preferably substantially equal to the field input signal across input impedance 44.

A partial parts list of the preferred embodiment of FIGS. 2A and 2B comprises: t,0130

Figure 3:
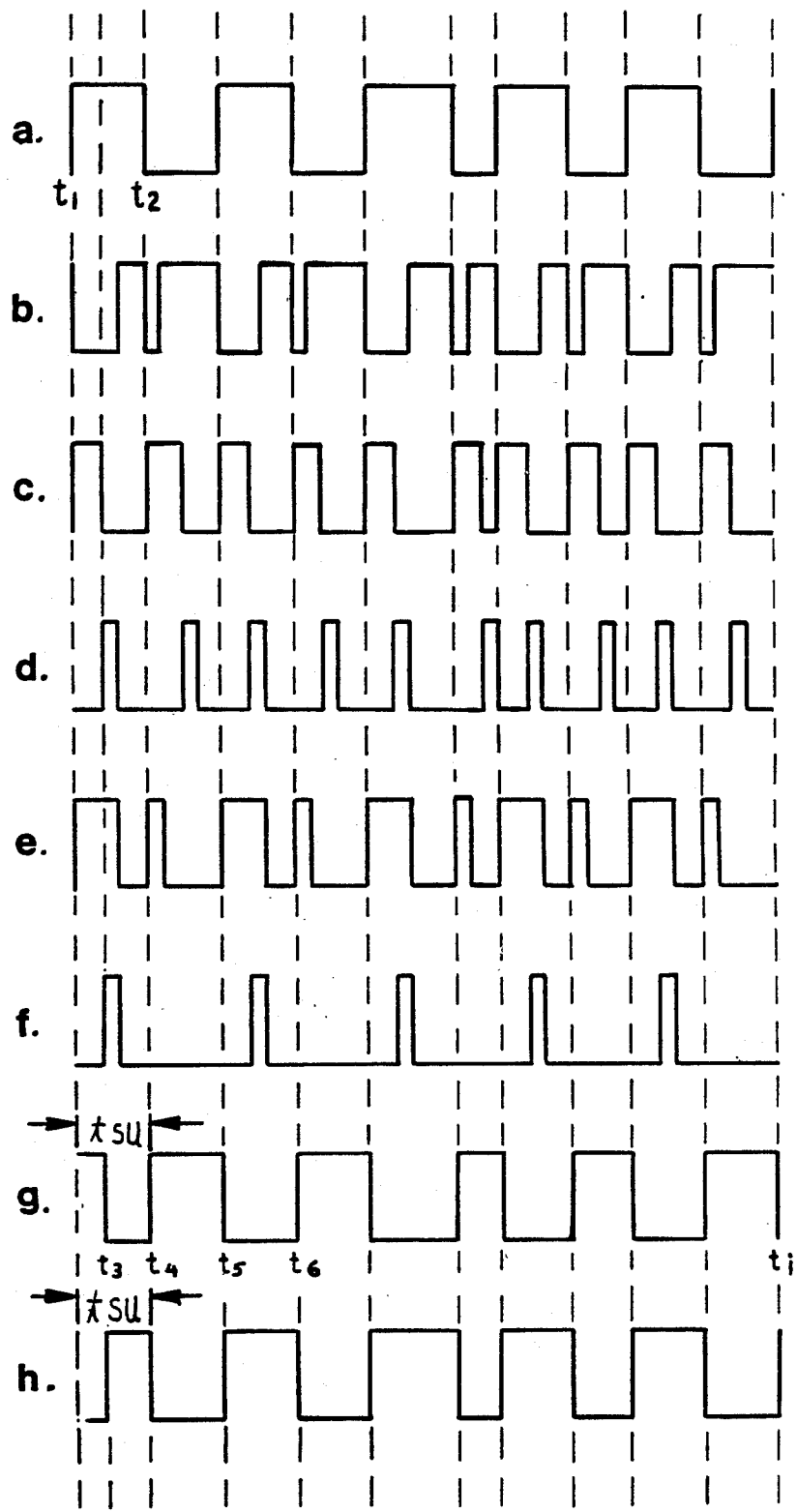
FIG. 3 is a timing diagram representation of the output device of FIGS. 2A and 2B.

An idealized timing diagram of the preferred operation of output circuit 32 is represented in FIG. 3, traces a through h. Signals appearing at the circled letters a through h on FIGS. 2A and 2B correspond to the traces of FIG. 3. The input signal 10 on line 16 is represented in trace a. Trace a shows the input signal 10 on line 16 as a pulse width modulated signal having a leading edge indicated at t1 and a trailing edge indicated at t2. Trace b represents the first and second isolated signals 27 and 28 on line 30 as a series of inverted pulses. Leading edges of input signal 10 in trace a, such as at t1 correspond to first isolated signal 27 which comprises pulses of longer duration than second isolated signal 28 which comprises pulses in trace b representing the trailing edges of input signal 10 in trace a. First isolated signal 27 should not be longer than the pulse width of input signal 10, and second isolated signal 28 should not be longer than the time between pulses of input signal 10. Trace c shows a series of first pulses from first one-shot 116 which is triggered by leading edges of the first and second isolated signals 27 and 28 of trace b. Trace d represents a series of second pulses from second one-shot 120 which is triggered by the trailing edges of the first pulses of first one-shot 116 in trace c. The first pulses of trace c have a selected duration longer than the duration of the second pulses in trace d, the sum of the first pulse duration and the second pulse duration preferably being less than the time between pulses of input signal 10 in trace a. Trace e represents inverted first and second isolated signals 27 and 28 on line 124 which is preferably an inversion of trace b. Trace f represents the AND logical condition of the second pulse from second one-shot 120, trace d and the inverted first and second isolated signals, trace e, and is used to reset flipflop 140 such as during startup of the circuit as indicated by a time frame tsu on traces g and h. Trace g represents the output signal on line 142 and as can be seen, at time t1 circuit 8 is turned on and at time t3, the logical AND of trace d and trace e is true so flipflop 140 is reset. In normal operation, flipflop 140 changes state as indicated in trace g upon receipt of leading edges of the signal in trace e, as indicated at t4, t5, t6 through ti. Trace h is simply the pulse width modulated output signal on line 152, an inversion of trace g. The first pulses g and h are representative of the startup time of the circuit indicated by time frame tsu. The total time t2−t1 between leading and trailing edges of trace a should be greater than the sum of the pulse durations in trace b which are representative of the leading and trailing edges in trace a.

In a further preferred embodiment of the present invention, the first and second signals 19 and 21, and corresponding first and second isolated signals 27 and 28 are equal duration pulses whose amplitude distinguishes between leading edge 12 and trailing edge 14 of input signal 10. The advantage of representing the leading and trailing edges by two distinctive signals to utilize turn-on time stability of isolation devices such as optical, electromagnetic or mechanical isolation devices is obtained so long as the signals have distinguishable characteristics representative of the leading and trailing edges respectively of input signal 10. Low cost and simple circuitry is used to implement the present invention because great accuracy of turn-off times of isolator 26 is not required nor do widths of the signals need to be precisely measured.

Figure 4:
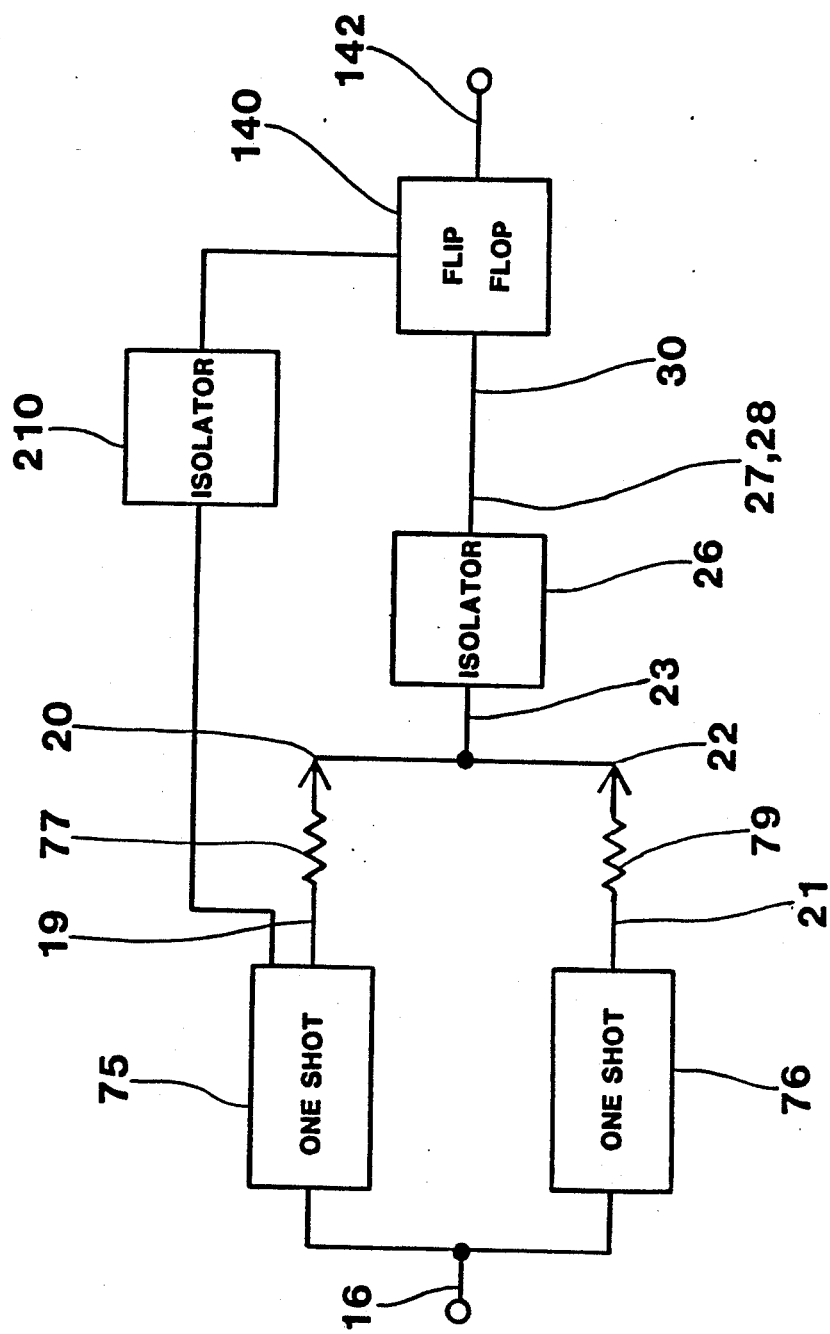
FIG. 4 is a part schematic, part block diagram of a further preferred embodiment of the present invention.

In yet a further preferred embodiment in FIG. 4 wherein the numbering is consistent with FIG. 2A and 2B, at least a portion of first signal 19 is optically coupled directly to flipflop 140 by an isolator 210 to directly reset flipflop 140. First and second signals 19 and 21 are then of shorter and preferably equal duration and are optically coupled directly to flipflop 140, still utilizing the immediately successive repeatability characteristics of isolator 26. The shorter durations of first and second signals 19 and 21 permit shorter duration pulse width modulated input signals to be isolated since the durations need not be distinguished.

Figure 5:
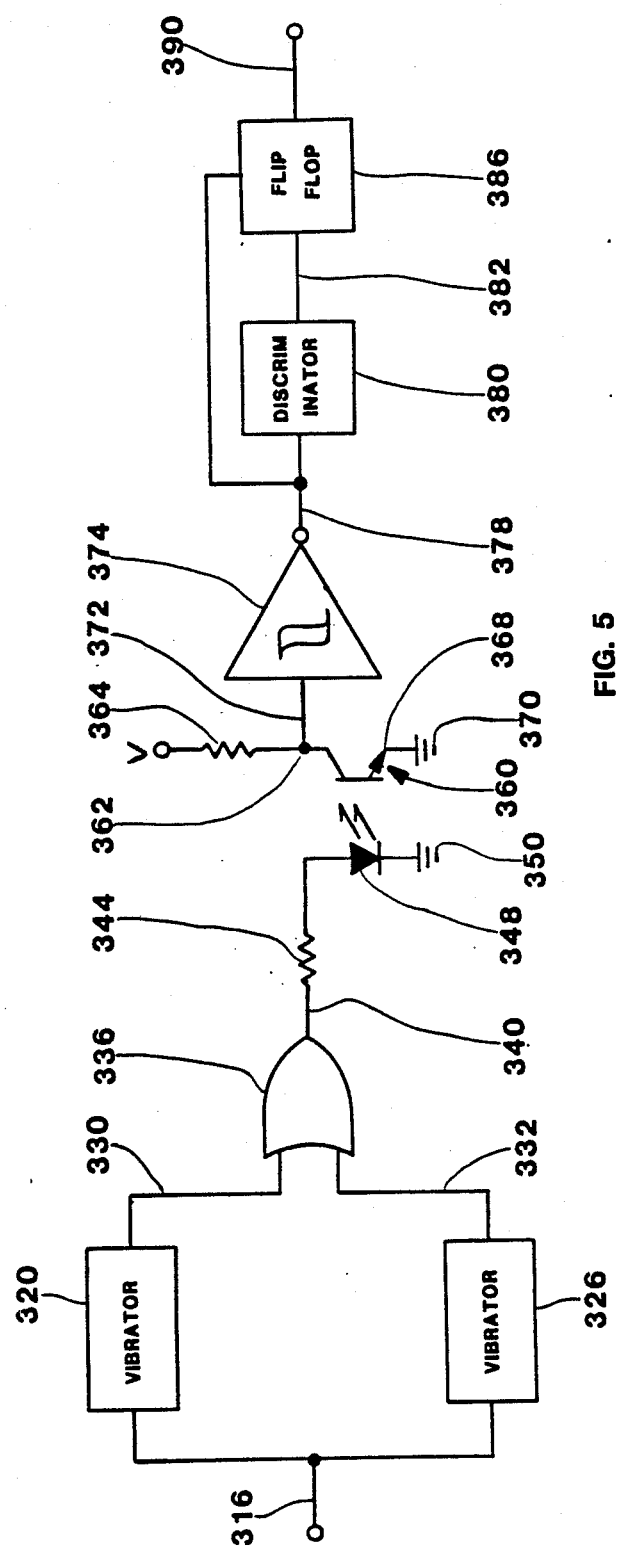
FIG. 5 is a schematic diagram of yet a further preferred embodiment of an electrical isolation circuit in accordance with the present invention.

In still a further preferred embodiment in FIG. 5, a pulse width modulated input signal on a line 316 is coupled to a first edge triggered monostable vibrator 320 and a second edge triggered monostable vibrator 326 which output on lines 330 and 332 respectively a first pulse and a second pulse corresponding to the leading and trailing edges of the input signal respectively. The first pulse is preferably of shorter duration than the second pulse. Lines 330 and 332 are coupled to a logical "OR" gate 336 for squaring the edges of and combining the first and second pulses on a line 340. Line 340 is coupled through a current limit resistor 344 and through a light emitting diode 348 to a first ground 350. Light emitting diode 348 provides light in response to the first and second pulses, preferably with a minimum delay which is equal relative to the first and second pulses. The light is received by the base of a photo transistor 360 having a collector 362 coupled through a resistor 364 to a voltage V and an emitter 368 coupled to a second ground 370 isolated from first ground 350. On receipt of the light from diode 348, the first and second pulses are inversely reproduced at collector 362. Collector 362 is coupled by a line 372 to a Schmitt trigger 374 for squaring the edges and inverting the first and second pulses. Trigger 374 provides the first and second pulses on a line 378 which are of the same polarity as the pulses on line 340 and are electrically isolated therefrom. A pulse discriminator 380 is coupled to line 378 and set such that the second pulse triggers a reset signal at the discriminator 380 output on a line 382. Line 378 is also coupled to a flipflop 386 having an output on a line 390. The leading edges of the first and second pulses cause the flipflop output to change state, while the reset signal on line 382 causes the flipflop to be reset during the second pulse, thus distinctly identifying the second pulse. Thus, a pulse width modulated output signal responsive to the first and second pulses on line 378 and the reset signal on line 382 is provided on line 390 electrically isolated from and preferably having an equal pulse width as the pulse width of the input signal on line 316.

While the present invention has been described with reference to preferred embodiments, it will be recognized by those skilled in the art that further preferred embodiments such as use of the turnoff characteristics of an isolation device to represent the input signal are also within the scope of the present invention.

What is claimed is:

1. An isolator circuit for providing dielectric isolation for an input signal which has a leading edge and a trailing edge spaced apart in time, the circuit comprising:

first means for receiving the input signal and for providing a first signal representative of the leading edge of the input signal and for providing a second signal representative of the trailing edge of the input signal; and isolation means having an isolation input coupled to the first means and having a single isolation output for providing a first isolated signal representative of the leading edge of the input signal and a second isolated signal representative of the trailing edge of the input signal and distinct from the first isolated signal, the isolation means providing signal transmission and dielectric isolation between the isolation input and the isolation output such that the first and second isolated signals are dielectrically isolated from the input signal and the time spacing between the leading edge and the trailing edges is substantially preserved in the isolation output.

2. The circuit of claim 1 wherein the first means provides the first signal proximate in time to receiving the leading edge of the input signal.

3. The circuit of claim 2 wherein the time between the first means receiving the leading edge and providing the first signal is relatively constant for immediately successive leading edges of the input signal.

4. The circuit of claim 1 wherein the first means provides the second signal proximate in time to receiving the trailing edge of the input signal.

5. The circuit of claim 4 wherein the time between the first means receiving the trailing edge and providing the second signal is relatively constant for immediately successive trailing edges of the input signal.

6. The circuit of claim 2 wherein the first means provides the second signal proximate in time to receiving the trailing edge of the input signal and wherein the time between the first means receiving the leading edge and providing the first signal and the time between the first means receiving the trailing edge and providing the second signal is substantially equal.

7. The circuit of claim 1 wherein the input signal alternately comprises a first high voltage and a first low voltage.

8. The circuit of claim 7 and further comprising a readout means coupled to the output of the isolation means for providing an output signal isolated from and representative of the input signal.

9. The circuit of claim 8 wherein the output signal alternately comprises a second high voltage and a second low voltage representative of and electrically isolated from the first high and low voltages.

10. The circuit of claim 9 wherein the difference between the first high voltage and the first low voltage is substantially equal to the difference between the second high voltage and the second low voltage.

11. The circuit of claim 1 and further comprising:
    load means for receiving an input current and providing a first input signal level;
    ramp means for providing a ramp signal; and
    comparator means coupled to the load means and to the ramp means for comparing the first input signal level to the ramp signal and providing the input signal as a function thereof.

12. The circuit of claim 11 and further comprising squaring means coupled between the comparator means and the first means for squaring the edges of the input signal.

13. The circuit of claim 11 wherein the input current comprises a 4 to 20 milliampere signal, the load means comprises a 250 ohm resistor and the first input signal level comprises a 1 to 5 volt signal.

14. The circuit of claim 1 wherein the first signal comprises a first pulse having distinct characteristics representative of the leading edge of the input signal.

15. The circuit of claim 14 wherein the first isolated signal comprises a pulse having distinct characteristics representative of the leading edge of the input signal responsive to the first pulse.

16. The circuit of claim 1 wherein the second signal comprises a second pulse having distinct characteristics different from the first signal characteristics representative of the trailing edge of the input signal.

17. The circuit of claim 16 wherein the second isolated signal comprises a pulse having distinct characteristics representative of the trailing edge of the input signal responsive to the second pulse.

18. The circuit of claim 1 wherein the first signal comprises a first pulse having a first pulse duration and wherein the second signal comprises a second pulse having a second pulse duration.

19. The circuit of claim 18 wherein one of the first and second pulse durations is longer than the other one of the first and second pulse durations.

20. The circuit of claim 18 wherein the first and second isolated signals comprise respective first and second isolated pulses having durations representative of the first and second pulse durations.

21. The circuit of claim 20 wherein the first pulse duration is substantially equal to the first isolated pulse duration and wherein the second pulse duration is substantially equal to the second isolated pulse duration.

22. The circuit of claim 20 and further comprising readout means for receiving the first and second isolated pulses and providing an output pulse width modulated signal having a leading edge and a trailing edge as a function of the first and second isolated pulses.

23. The circuit of claim 22 wherein the readout means comprises flipflop means for receiving the first and second isolated pulses and providing the leading edge of the output pulse width modulated signal as a function of the first isolated pulse and the trailing edge as a function of the second isolated pulse based on the time between and durations of the first and second isolated pulses.

24. An electrical isolation circuit for providing insulating isolation for an input signal which has a leading edge and a trailing edge spaced apart in time, the circuit comprising:

first means for receiving the input signal and providing a first signal representative of the leading edge of the input signal and for providing a second signal representative of the trailing edge of the input signal;

light emitting means having an isolation input for receiving the first and second signals and having a single light emitter which emits light signals responsive to the first and second signals; and light responsive means electrically insulated from the light emitting means and optically coupled to the light emitting means for receiving the emitted light signals and providing a first isolated signal and a second isolated signal responsive to the received light signal such that the spacing between the leading and trailing edges is substantially preserved in the first and second isolated signals.

25. A circuit for providing electrical insulating isolation between an input signal and an output signal, the circuit comprising:

isolation means having an isolation input and a single isolation output for providing electrical insulating isolation and signal transmission between the isolation input and the isolation output;

first means having an input for receiving the input signal and having an output coupled to the isolation input, said first means providing a first pulse and a second pulse at its output, the first and second pulses having a time relationship representative of the input signal; and output means coupled to the isolation output for providing the output signal such that the time relationship is substantially preserved in the output signal.

26. The circuit of claim 25 wherein the isolation means further comprises means coupled to the first means for providing a signal coincident with the first pulse such that the first pulse is distinguished from the second pulse.

* * * * *

UNITED STATES PATENT AND TRADEMARK OFFICE
CERTIFICATE OF CORRECTION

PATENT NO. : 4,678,937

DATED : July 7, 1987

INVENTOR(S) : Timothy D. Price

It is certified that error appears in the above-identified patent and that said Letters Patent is hereby corrected as shown below:

Column 6, line 2, after "comprises:", delete "t,0130".

Column 6, before line 3, insert the following table:

-- 
| | | |
|---|---|---|
| Buffer Amplifier | 47 | OP-20HP operational amplifier |
| Comparator Amplifier | 52 | LM 311 comparator amplifier |
| Ramp Generator | 54 | LM 555 timer |
| Buffer Amplifier | 58 | 1/4 LM 324 operational amplifier |
| Squaring Device | 71 | 40106B Hex Schmitt Trigger Inverter with all six inverters connected in parallel |
| Isolator | 26 | 6N 139 Opto-Coupler |
| Oneshots | 116 & 120 | 4538B Retriggerable One-Shots |
| Oneshots | 75,76 | 4538B Retriggerable One-Shots |
| Inverter | 122 | 4011B |
| Nand Gate | 126 | 4011B |
| Inverter | 130 | 4011B |
| Flipflop | 140 | 4013B |
| Squaring Device | 146 | 40106B Hex Schmitt-Trigger Inverter with all six inverters connected in parallel |

--.

Signed and Sealed this

Fifteenth Day of December, 1987

*Attest:*

DONALD J. QUIGG

*Attesting Officer*  *Commissioner of Patents and Trademarks*